(12) United States Patent
Eiles et al.

(10) Patent No.: US 6,882,170 B2
(45) Date of Patent: Apr. 19, 2005

(54) DEVICE SPEED ALTERATION BY ELECTRON-HOLE PAIR INJECTION AND DEVICE HEATING

(75) Inventors: Travis Eiles, Beaverton, OR (US); Jeremy A. Rowlette, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 10/313,933

(22) Filed: Dec. 5, 2002

(65) Prior Publication Data

US 2004/0108868 A1 Jun. 10, 2004

(51) Int. Cl.[7] ............................................. G01R 31/26
(52) U.S. Cl. ................................. 324/765; 324/158.1
(58) Field of Search ................................ 324/754, 755, 324/757, 758, 765, 501, 512, 750, 751, 752, 753, 158.1

(56) References Cited

U.S. PATENT DOCUMENTS 4,698,587 A    10/1987  Burns et al.
4,777,434 A  * 10/1988  Miller et al. ................. 324/757

\* cited by examiner

Primary Examiner—David Zarneke
Assistant Examiner—Russell M. Kobert
(74) Attorney, Agent, or Firm—Schwabe, Williamson & Wyatt, P.C.

(57) ABSTRACT

Integrated circuit and integrated circuit device diagnostic methods and apparatus in accordance with the present invention are provided. The IC is operated to produce an output marginally above a pass-fail threshold for a particular performance criteria. The IC is made to fail that criteria by inducing an electrical stress in an IC device that is of marginal design for that particular criteria. The electrical stress acts to minutely degrade the performance of the IC device driving the IC below the pass-fail threshold. When each IC device is stressed in accordance with the embodiments of the present invention, marginal IC devices are identified to enable the design to be modified. The induced electrical stress is non-destructive to the IC device and IC, which permits a repeatable diagnostic process, as well as allows for the diagnostic testing of other IC devices in the same microcircuit.

16 Claims, 6 Drawing Sheets

DEVICE SPEED ALTERATION BY ELECTRON-HOLE PAIR INJECTION AND DEVICE HEATING

FIELD OF THE INVENTION

The present invention relates to integrated circuit design diagnostics and, more particularly, to non-damaging, repeatable methods for determining integrated circuit device functionality.

BACKGROUND OF INVENTION

The design of integrated circuits (IC) involves the study of semiconductor physics, integrated circuit processing, transistor-level design, logic-level design, system-level design, testing, and evaluation. In testing and evaluating a new IC design, the designer must have the ability to find, characterize and fix, otherwise known as debug, design-related, as well as process-related issues, that limit IC device performance or production yields. Random variations in critical IC device parameters result in performance variations that must be evaluated. The root-cause of these issues must be identified and designed out of the IC. For example, timing measurements to assess design functionality, in particular, have become a critical factor in achieving the ever-increasing challenge of reliably producing faster and faster microelectronic devices.

In the following description, reference is made to integrated circuit (IC), IC device, microelectronic die, carrier substrate, microelectronic device, and microelectronic package. An IC is an interconnected network of microcircuits which form discrete IC devices. A microelectronic die comprises a die substrate upon which microcircuits are formed. Examples of die substrates include, among others, wafers of silicon (Si), gallium arsenide (GaAs), indium phosphide (InP) and their derivatives. Various techniques are used, such as layering, doping, masking, and etching, to build thousands and even millions of microscopic IC devices in the form of transistors, resistors, capacitors and others on the microelectronic die. The IC devices are interconnected to define specific electronic circuits that perform specific functions, such as the function of a microprocessor or a computer memory.

A microelectronic device is defined as a microelectronic die electrically interconnected with a carrier substrate. A microelectronic package is a microelectronic device that is configured as a finished package with additional components, such as electrical interconnects, a die lid, a heat dissipation device. An example of a microelectronic package includes, but is not limited to, a flip-chip ball grid array (FC-BGA) microprocessor package.

The IC design debug process is accomplished by applying a great deal of understanding and expertise in architecture and circuit design to the testing and analysis of test results to find the root-cause of marginal circuit performance. This is done using, among other things, design-for-test and design-for-debug features integrated into the IC itself, software tools and automated test equipment, and specialized diagnostic equipment which allow optical probing and time-resolved emission analysis. In general, this root-cause analysis is one of the most time-consuming tasks of the debug phase of product development and has a major impact on engineering and production tape-out schedules.

The challenge to analyze IC's increases as IC device complexity increases. To debug and validate the newest IC designs, advanced diagnostic technology is required that is sophisticated enough to analyze sub-micron sized IC devices as well as able to produce diagnostic data quickly and in a format easily understood by those not possessing extensive knowledge of the specific IC architecture of the IC being tested.

State of the art test and debugging tools such as logic analyzers, in-circuit emulators, and microprocessor development systems, and those already discussed, do not satisfy this need completely. These tools suffer from limitations which include poor IC device resolution, extensive labor and time to perform and analyze, and require that the test and evaluation of the diagnostic data be performed by those having expertise in architecture and circuit design. Additionally, these tools are limited in their ability to diagnose individual IC devices when the microelectronic die is packaged and integrated with a carrier substrate. In FC-BGA and FC-PGA packages, for example, only the back-side of the microelectronic die is exposed once interconnected with the carrier substrate, precluding direct access to the IC devices via the die interconnect pads.

The essence of the problem to be addressed is to provide a non-destructive and repeatable evaluation of IC devices, individually as well as a part of a complex circuit. This evaluation should assist in the design process to identify those IC devices or the design of the circuit comprising a group of IC devices that are hindering the goal of meeting all of the desired performance requirements of the microelectronic die and package. These performance requirements are specifiable in terms of circuit speed, noise immunity, and chip area, among others.

For the reasons stated above, and for other reasons stated below which will become apparent to those skilled in the art upon reading and understanding the present specification, there is a significant need in the art for methods that provide IC evaluation to identify those IC devices and/or combination of IC devices in a particular circuit path that are limiting the overall performance of the microelectronic die. Additionally, there is a need for methods to enable those without design expertise to acquire relevant data which is easily identifiable as meeting a pass/fail threshold. The methods must address the need to meet the challenge of both package level and die level evaluation of deep-submicron IC devices. Further, the methods need to provide non-destructive, repeatable, high bandwidth evaluation of the IC in which only the backside of the microelectronic die is accessible, such as the case wherein the die is assembled into a microelectronic package.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention.

A method of evaluating an integrated circuit (IC) to identify the performance-degrading IC devices and/or the circuits comprising those devices is provided. In the following description, numerous specific details are set forth in order to provide a thorough understanding of the present invention. It will be obvious, however, to one skilled in the art, that the present invention can be practiced without these specific details. In other instances, some details have been omitted in order to avoid obscuring the present invention.

Embodiments in accordance with the present invention provide methods in which an IC device and/or group of IC devices is electrically tested to identify performance-limiting circuit design. The electrical test includes driving a test signal through an IC device while the IC is operated at a marginally acceptable performance state. That is, the test conditions, including, but not limited to, temperature, voltage and operating speed, are fixed in such a way that the particular IC operates at a marginally acceptable performance state. Marginally acceptable behavior is defined wherein the IC device exhibits a test output that is susceptible to minute changes in temperature, voltage and frequency.

The test signal will alter the operating characteristics of a performance-limiting IC device, and therefore, change the performance of the IC resulting in the IC falling either above or below a predetermined acceptable performance threshold. A pass/fail performance threshold is predetermined and each IC device, and/or group of devices, is presented with a test signal so as to identify the performance-limiting IC devices simply by monitoring the easily identifiable pass/fail performance of the IC while a particular IC device is subjected to predetermined test conditions. Test condition parameters include, among others, temperature, voltage, and operating frequency, which are adjustable in such a way that the IC operates at a marginal state.

Figure 1:
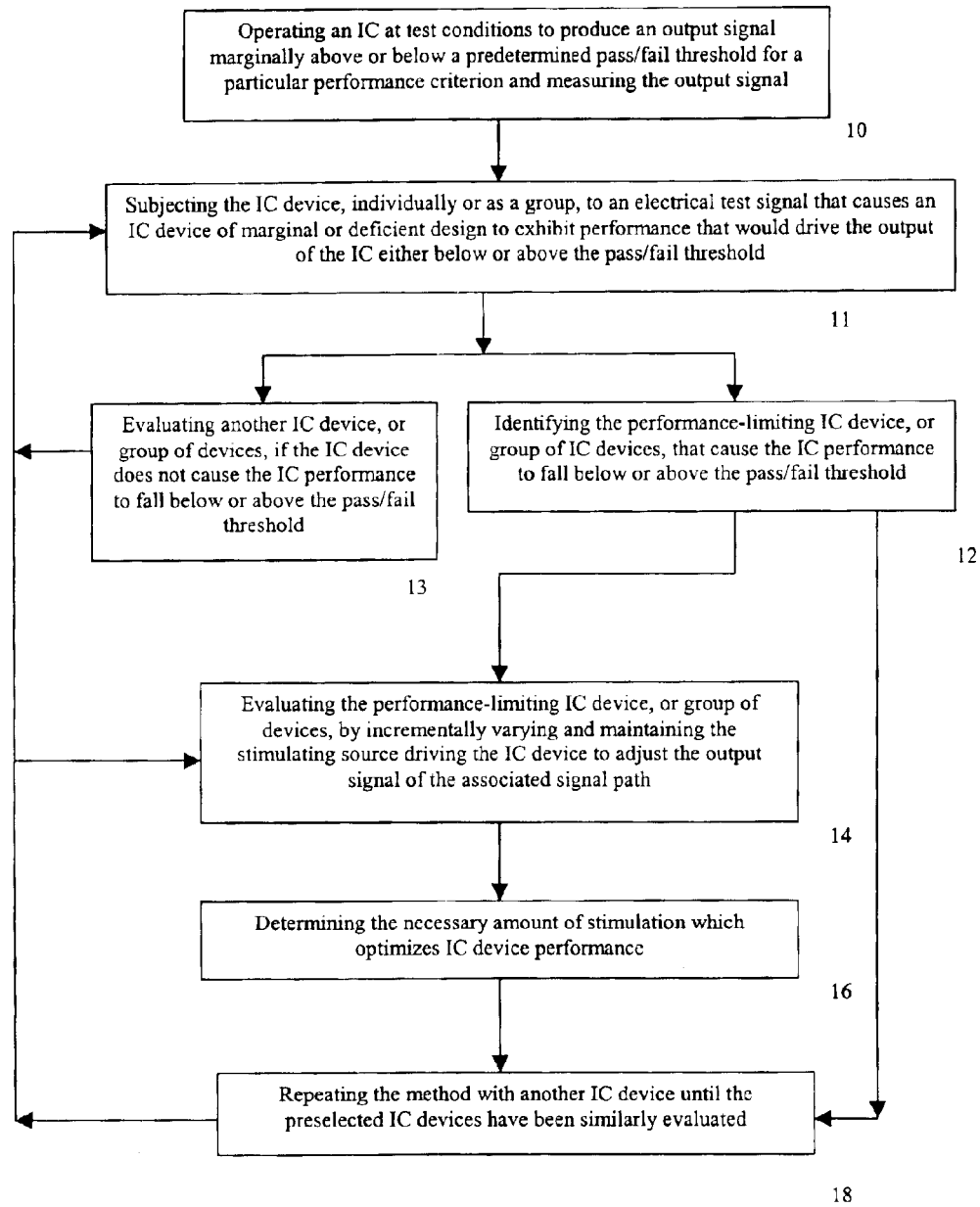
FIG. 1 is a flow diagram of methods for determining IC device functionality, in accordance with embodiments of the present invention.

FIG. 1 is a flow diagram illustrating a method of identifying an IC device having a marginal or deficient design, in accordance with an embodiment of the present invention. The method comprises: operating an IC at test conditions to produce an output signal marginally above or below a predetermined pass/fail threshold for a particular performance criterion and measuring the output signal 10; subjecting the IC device, individually or as a group, to an electrical test signal that would cause an IC device of marginal or deficient design to exhibit performance that would drive the output of the IC either below or above the pass/fail threshold 11; identifying the performance-limiting IC device, or group of IC devices, that cause the IC performance to fall below or above the pass/fail threshold 12; repeating the method with another IC device until the preselected IC devices have been similarly evaluated 18; and evaluating another IC device, or group of devices, if the IC device does not cause the IC performance to fall below or above the pass/fail threshold 13.

The IC is operated under test conditions that cause the IC to produce an output signal marginally above or below a predetermined pass/fail threshold for a particular performance criterion. The output signal is measured. It is anticipated that the test conditions under which the IC is operated can comprise any number of conditions particular to a specific evaluation parameter. In one embodiment, the IC is operated using a single constant or repetitive input signal, such as would be provided by standard testing equipment, which would be adjusted to drive the IC to a specific marginal operating state. In another embodiment, the IC is operated under test conditions at the system-level running software applications wherein a slight change in the characteristics of an IC device within the marginal circuitry will change the overall system behavior.

The IC device, individually or as a group, is subjected to a test signal sufficient to cause an IC device of marginal or deficient design to exhibit performance that would drive the performance of the IC either below or above the pass/fail threshold. The test signal can be in the form of a change in voltage, current, resistance, frequency, or other electrical state as determined for a particular purpose. The parameters of the test are selected such that a performance limited IC device will cause the IC to perform either below or above a predetermined performance pass/fail threshold.

Identification is made of the performance-limiting IC device, or group of IC devices, that causes the IC to fail the evaluation allowing for further scrutiny of the critical device or devices enabling the design to be modified appropriately, that is, redesigned. The identification is simply based on whether the IC passes or fails a predetermined performance threshold, regardless of the specific IC design or architecture. The test equipment simply indicates which IC device, or group of IC devices, is being evaluated and whether the IC is driven below or above the threshold. The evaluation is carried out for all of the IC devices of interest. The IC devices identified to drive the IC either below or above the performance threshold are identified for further scrutiny.

Referring again to FIG. 1, the performance-limiting IC device, or group of IC devices, is further evaluated under a test signal that varies over time, in another embodiment of the method in accordance with the invention. The method comprises the previously described method for identifying the performance-limiting IC device or group of devices that cause the IC to fail the evaluation 10, 11, 12 and 13, further comprising: evaluating the performance-limiting IC device, or group of devices, by incrementally varying and maintaining the stimulation source of the IC device to adjust the output signal of the associated signal path 14; determining the necessary amount of stimulation which optimizes IC device performance 16; and repeating the method with another IC device until the preselected IC devices have been similarly evaluated 18.

Referring again to FIG. 1, the performance-limiting IC device, or group of IC devices, is evaluated under a test signal that varies over time, in another embodiment of the method in accordance with the invention. The method comprises: evaluating the performance-limiting IC device or group of devices by incrementally varying and maintaining the stimulation source driving the IC device to adjust the output signal of the associated signal path 14; determining the necessary amount of stimulation which optimizes IC device performance 16; and repeating the method with another IC device until the preselected IC devices have been similarly evaluated 18.

The three embodiments identified by the above examples can be generalized in terms of how the stimulation source and test signals are provided to the IC device or group of IC devices. The stimulation source is defined to be in "scan mode," wherein the test signal periodically exercises the IC device or group of IC devices of interest while the stimulation source scans the region of interest and all devices of interest are evaluated. The stimulation source is defined to be in "park mode," wherein the test signal exercises the device or group of devices periodically such that all IC devices of interest are evaluated; then the magnitude of the stimulation source is made dynamic or variable while evaluating a specific device before moving on to the next device.

By way of example, as provided in the above embodiments, it is understood that the various individual evaluations described within each embodiment can be performed as stand-alone evaluations. Therefore, embodiments of the invention are not limited to specific evaluation sequences or combinations.

Figure 2:
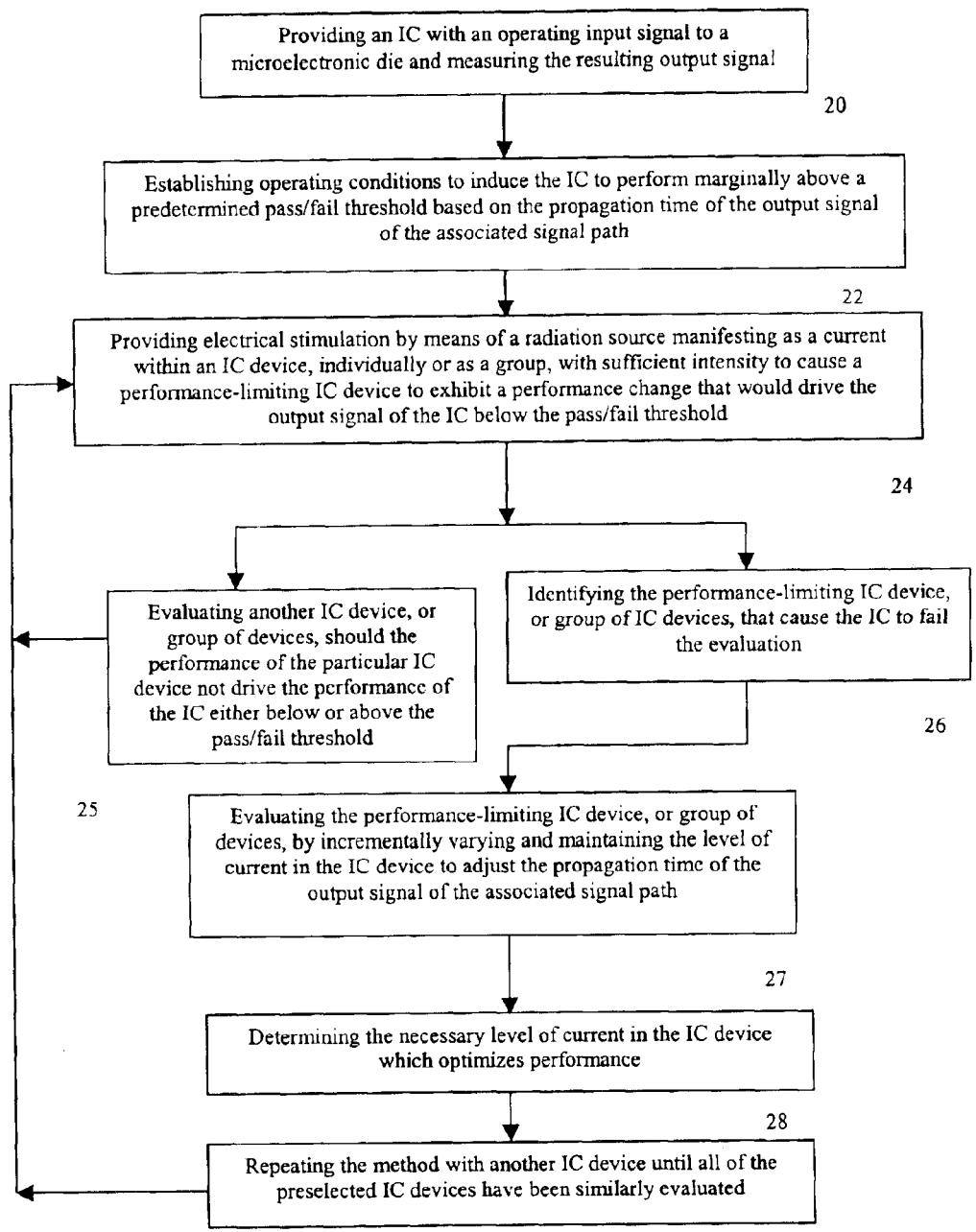
FIG. 2 is a flow diagram of methods for determining IC device functionality, in accordance with embodiments of the present invention.

FIG. 2 is a flow diagram of a method of identifying an IC device having a marginal or deficient design, in accordance with another embodiment of the present invention. The method comprises: providing an IC with an operating input signal to a microelectronic die and measuring the resulting output signal 20; establishing operating conditions to induce the IC to perform marginally above a predetermined pass/fail threshold based on the propagation time of the output signal of the associated signal path 22; providing electrical stimulation by means of a radiation source manifesting as a current within an IC device, individually or as a group, with sufficient intensity to cause a performance-limiting IC device to exhibit a performance change that would drive the output signal of the IC below the pass/fail threshold 24; identifying the performance-limiting IC device, or group of IC devices, that cause the IC to fail the evaluation 26; evaluating the performance-limiting IC device or group of devices by incrementally varying and maintaining the level of current in the IC device to adjust the propagation time of the output signal of the associated signal path 27; determining the necessary level of current in the IC device which optimizes performance 28; repeating the method with another IC device until all of the preselected IC devices have been similarly evaluated 29. Should the performance of the particular IC device not drive the performance of the IC below the pass/fail threshold, that IC device is marked satisfactory and the method is repeated by evaluating another IC device 25.

Various performance parameters may be used to establish the performance threshold. The choice of the threshold parameter is chosen for a particular evaluation purpose. Performance parameters that can be used for evaluation include, but are not limited to, propagation delay, clock skew measurement, and soft failures across multiple transistors on the IC device.

For example, a minor change in the electrical behavior of a critical-path IC device is sufficient to affect the timing of the signal path, and consequently, the logic state seen at the output of the IC. A minute current can be induced into an individual IC device, or group of IC devices, responsible for marginal signal timing performance which are then targeted for further scrutiny. Since the marginal IC device is identified by simply evaluating whether the IC performs above or below a pass/fail threshold and thus passing or failing the evaluation, the identification of critical path IC devices can be made by testing personnel who do not possess detailed knowledge of the circuit design.

A stimulation source induces a minute change in voltage within the IC device thus causing a minute change in the IC device current output for an IC device, or group of IC devices, using a number of techniques. Two of those techniques include, but are not limited to, electron-hole injection and localized heating.

It is a known phenomenon that a current is generated within a semiconductor p-n junction is produced as a result of the absorption of photons. The current is caused by the internal drift of holes and electrons. When radiation of sufficient energy ($\epsilon$) strikes a semiconductor, electrons are excited out of their valence band state and consequently leave a hole. This process is known as the creation of an electron-hole pair. The energy needed to create an electron-hole pair at a given temperature is independent of the type and the energy of the radiation. In silicon (Si), this energy is equal to 1.12 eV at room temperature.

The creation of an electron-hole pair leaves two liberated charge carriers that are opposite in polarity; one positive and one negative. Since there is an electric field present in the depletion region, charged particles liberated in the depletion region will be swept out of the area. After the electron-hole pair is created, the positive charge carrier will be swept towards the n-type region of the p-n junction, and the negative charge carrier will be swept towards the p-type region of the p-n junction, by the electric field. The movement of these charge carriers constitutes a minute current that can be measured and analyzed. Current due to the diffusion of electron hole pairs generated in the bulk substrate in proximity to the p-n junction is also considered.

In accordance with an embodiment of the method of the present invention, the IC device characteristics are altered by irradiating the device with radiation to produce electron-hole pairs, and thus a test signal in the form of a current, within the IC device. The radiation is non-destructively focused on the IC device to inject the electron-hole pairs into the target IC device. The radiation can be focused on IC devices at the surface or below the surface of the die substrate, depending on the transparency of the die substrate to a specific radiation source. The small photocurrent that is produced in the IC device by this electron-hole pair injection is used as a test signal to drive a performance-limiting IC device into a condition to cause the IC to perform either above or below, and therefore fail or pass, a predetermined performance threshold.

The constant value of $\epsilon$ for different types of radiation contributes to the versatility and flexibility of the type of radiation source that can be used in producing the current-producing electron-hole pairs. Examples of radiation suitable for the purpose include, but are not limited to, electromagnetic (such as, but not limited to, laser), electron beam, and ion beam.

Figure 3:
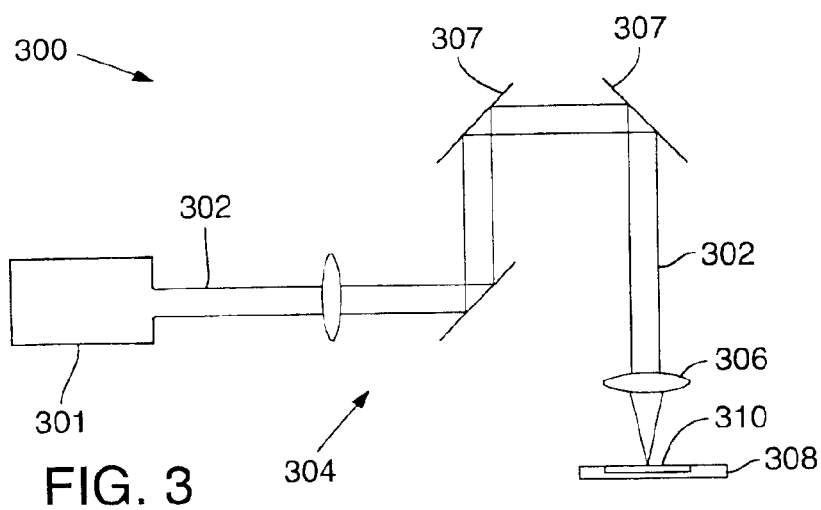
FIG. 3 illustrates a schematic of a radiation source in the form of a laser beam produced by a laser apparatus, in accordance with an embodiment of the method of the present invention.

FIG. 3 illustrates a radiation source in the form of a laser beam 302 produced by a laser apparatus 300, in accordance with an embodiment of the present invention. A laser produces the laser beam 302 which is focused by various optics 304, including a microscope objective 306, onto the target IC device 310. The laser beam 302 is steered with steering mirrors 307 to enable the laser beam 302 to scan at least a portion of interest of the IC 310 to irradiate individual or groups of IC devices. A three-axis, high-resolution translation system 308 is used to position the IC 310, at the focus of the laser beam 302. Resolution of the laser beam 302 as small as 0.5 μm is obtainable with current state of the art equipment. As resolution is improved, IC devices of smaller scale can be evaluated. The laser beam 302 produces photocurrent within the IC device 310 by creating electron-hole pairs at one or more predetermined locations on the IC device.

A laser system suitable for practicing methods of the invention for evaluating microelectronic die includes continuous-wave and pulsed lasers. Electron-hole pairs are generated based upon the laser power coupled to the device and the photon wavelength. Photons with energy below the bandgap of the substrate generally produce heat at the target. Photons with energy at or above the bandgap of the substrate produces electron-hole pairs at the target in addition to heat. Therefore, a laser system can be used to provide the test signal to evaluate the IC devices using the method of the present invention, electrically altering the IC device characteristics using either heat or electron-hole pairs.

Shown by way of example of the application of an embodiment of the method in accordance with the invention, a silicon (Si)-based microelectronic die is tested. Silicon is semi-transparent to bandgap radiation energy produced by a laser operating in the near infrared wavelengths to a depth of 100 μm below the surface of the die substrate. This provides that IC devices within 100 μm of the surface of the die substrate can be accessed using non-damaging radiation. Further, for microelectronic packages comprising a microelectronic die, IC devices within 100 μm of the exposed backside surface of the microelectronic die can be accessed using the non-damaging radiation in accordance with the methods of the present invention. This package-level accessibility provides for die and system-level testing of the IC that has progressed further down the production line.

As mentioned above, the advantage provided by the laser beam to penetrate into the die substrate is particularly useful in evaluating an IC that is on a packaged microelectronic die. One example of a microelectronic package is a flip chip-pin grid array (FC-PGA) integrated circuit (IC) package. In FC-PGA packaging, the land-side of a microelectronic die which contains the electrical interconnects is coupled to a carrier substrate. With the land-side facing the carrier substrate, only the backside of the microelectronic die is exposed. The laser is controlled to produce a predetermined wavelength and energy to penetrate the backside of the substrate to illuminate the packaged IC. With the suitable wavelength and energy, the laser can probe as deep as 100 μm.

In one embodiment in accordance with the method of the present invention, a laser having a wavelength ranging from approximately 1.0 μm to 1.5 μm is focused to irradiate individual or groups of individual IC devices of the IC. The wavelength of approximately 1.0 μm corresponds to the silicon bandgap energy at approximately 300K. The significance of using a wavelength that corresponds to the silicon bandgap energy is that the electron-hole pairs are much more strongly generated with the shorter wavelength, leading to a greater change in the IC device characteristics. This photon energy generates electron-hole pairs which produce localized photocurrent injection into the IC device, which leads to controlled perturbations in circuit timing.

For IC devices produced on a GaAs carrier substrate, a wavelength of approximately 0.9 μm at GaAs bandgap energy of 1.427 eV at 300K, would be appropriate.

The electron-hole pairs are produced at the IC device by focusing the laser beam through the backside of the microelectronic die to the IC device being tested. The electron-hole pairs produced alter the electrical characteristics of the IC device changing the functionality of the circuit in the time domain.

Figure 4:
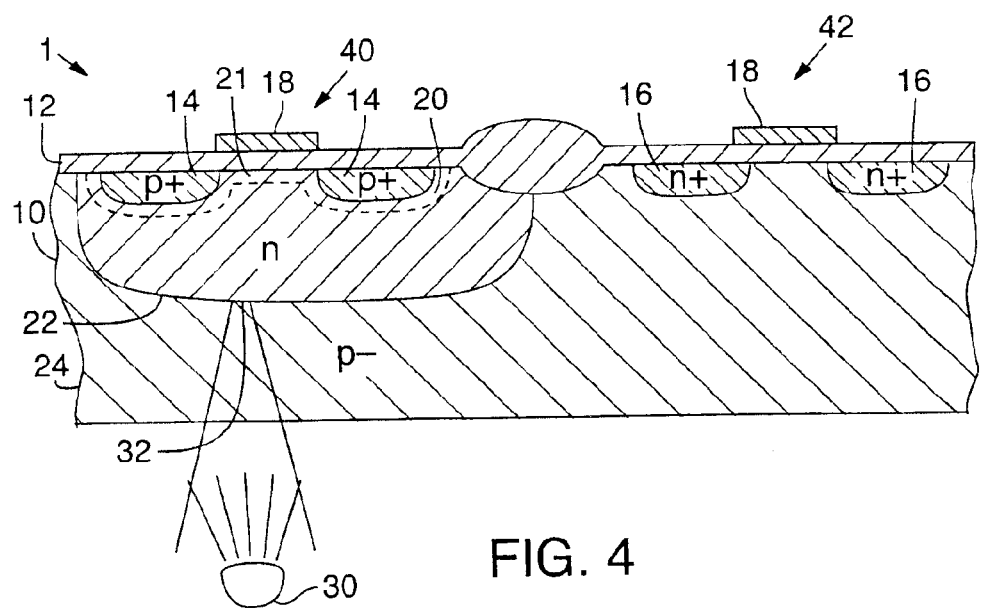
FIG. 4 is a representation of a CMOS device.

Shown by way of example, one type of IC device that can be evaluated using the methods in accordance with the invention includes, but is not limited to, a metal oxide field effect transistor (MOSFET). A MOSFET created on a semiconductor substrate is a common IC device found in the art. FIG. 4 is an illustration presenting a complimentary-MOS (CMOS) structure 1 that comprises an n-MOS FET 42 and a p-MOS FET 40 positioned side-by-side on a p-type substrate 10.

The p-MOS FET 40 of the above example, formed on a p-type substrate 10, is a bipolar junction comprising an n-type region, known as the n-well 22, with two highly conducting spaced-apart p-type semiconductor regions 14 which act as a source and drain of holes. A voltage applied to the gate electrode relative to the remaining transistor electrodes controls the conducting path between the two p-type regions 14. A relative voltage applied to one of the two p-type regions 14 determines whether the region 14 is a source or drain of holes.

In accordance with a method of the invention, the FET's 40, 42 are scanned by the laser while the pass/fail behavior of the IC for a given test pattern is measured using a standard tester. For example, the laser beam 30 illuminates the n-well/substrate junction 32 of the p-MOS FET to produce a photocurrent. The injection of the photocurrent in the n-well/substrate junction 32 causes a threshold voltage shift in the p-MOS FET 40 by decreasing the local voltage within the n-well 22. Any unavoidable injection of photocurrent into the drain produces a much weaker, $2^{nd}$ order effect that is of little consequence to the evaluation. The electron-hole pairs created at the focus of the laser beam 30 changes the current-voltage characteristics of the p-MOS FET 40 and hence alters the signal timing for the circuits following the p-MOS FET 40 in the signal chain. The FET's that are responsible for the marginal circuit behavior are identified through the change in signal timing which effects the pass/fail conditions of the test.

In an embodiment in accordance with the present invention, the laser beam moves in a continuous pass from one IC device to the next with the IC output signals measured. This is referred to as the "scan condition". When the laser beam illuminates a performance-limiting IC device, the IC output will deviate either below or above the predetermined threshold and the marginal IC device is thus identified.

In another embodiment of the method in accordance with the invention, the laser beam is focused and held on a single FET or a group of FET's in close proximity. This is referred to as the "parked condition". In the parked condition, the power of the laser incident on the FET under test through the backside of the microelectronic die is incrementally varied and maintained so as to precisely adjust the propagation time of the output signal of that particular signal path. This technique is used to precisely determine the necessary changes in the FET, or circuit of interest, that are needed for optimizing the IC performance.

By way of example, an application of this method includes, but is not limited to, the determination of circuit stability where the time of arrival of one signal with respect to another signal is critical to the stability of the circuit and hence the integrity of the output. This is often the case when an output is to be latched according to a globally synchronized clock signal. In certain circumstances, erroneous data can be latched if the data signal is faster than or slower than the clock edge event. This method is especially useful in the design of clock distribution circuits where skew can limit the overall timing of the integrated circuit.

In one application of the method, the injection of electron hole pairs is used to intentionally initiate race conditions in logic chains in order to test the stability of a particular circuit thus simulating the presence of signal skew.

In another embodiment of the invention, localized IC device heating is used to affect the current-voltage characteristics by reducing the effective mobility of charge carriers. The technique of localized heating generally induces timing delays for the illuminated signal path. Since the IC device will be operated under conditions where a small change in the transistor characteristic will cause the IC performance to change the pass/fail behavior, either pass to fail or fail to pass, the laser-based heating technique will allow performance-limiting transistors to be identified.

Figure 5:
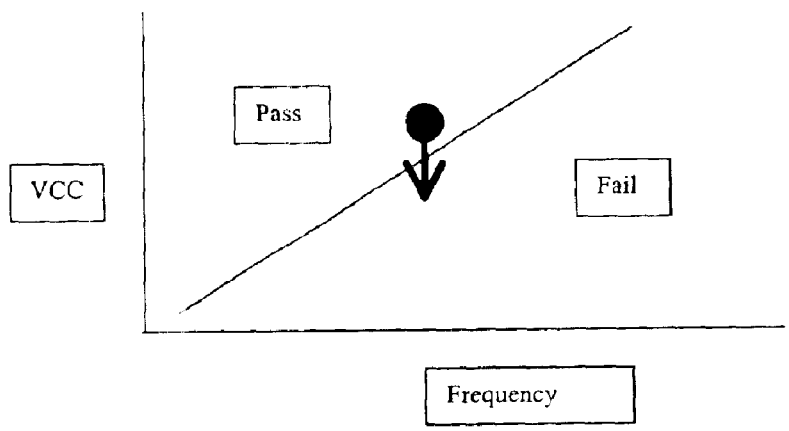
FIG. 5 is a graph depicting the pass/fail threshold as a two-dimensional function of power supply voltage and IC frequency, in accordance with the embodiments of the method of the present invention.

FIG. 5 is a graph depicting the pass/fail outcome of an IC device-level test as a two-dimensional function of power supply voltage VCC and IC frequency. For certain speedpath defects, the test pattern passes shown by data above a pass/fail threshold at high VCC and at low frequency. Conversely, at high frequencies and low VCC, certain test patterns fail as shown by data below the pass/fail threshold. The two regions are shown separated by the diagonal pass/fail threshold line. Other circuit faults can exhibit different behaviors evidenced by the VCC and IC frequency data. The voltage and frequency can be set very close and slightly above the threshold line to create marginal behavior in the IC. A slight change in the characteristic of a performance-limiting IC device will cause the IC to exhibit changes in the nominal behavior of the IC for the given bias state shown as data falling above or below the pass/fail threshold line.

To validate the methods in accordance with the invention, an optical microscope system was used to focus laser radiation to a diameter in the range including approximately 0.5 to 1.5 microns on an IC transistor through the backside of a silicon die substrate. The laser irradiation was focused on various IC devices at different locations of the IC. Known and readily available automatic test equipment was used to supply a test pattern to the IC with ability to measure the behavior of the IC at a fixed clock frequency.

Laser-induced photocurrent was injected into either the source/drain region or the n-well/substrate region of the transistor. Measurements of transistor electrical characteristics (e.g. Id-Vsg) were measured while illuminating the device with the laser operating at the target wavelength of 1.064 microns. Data were taken on n-MOS and p-MOS FET IC devices located on a 0.25 um scale process test IC. The dominant mechanism observed was voltage threshold, Vth, reduction in a p-MOS FET.

Figure 6:
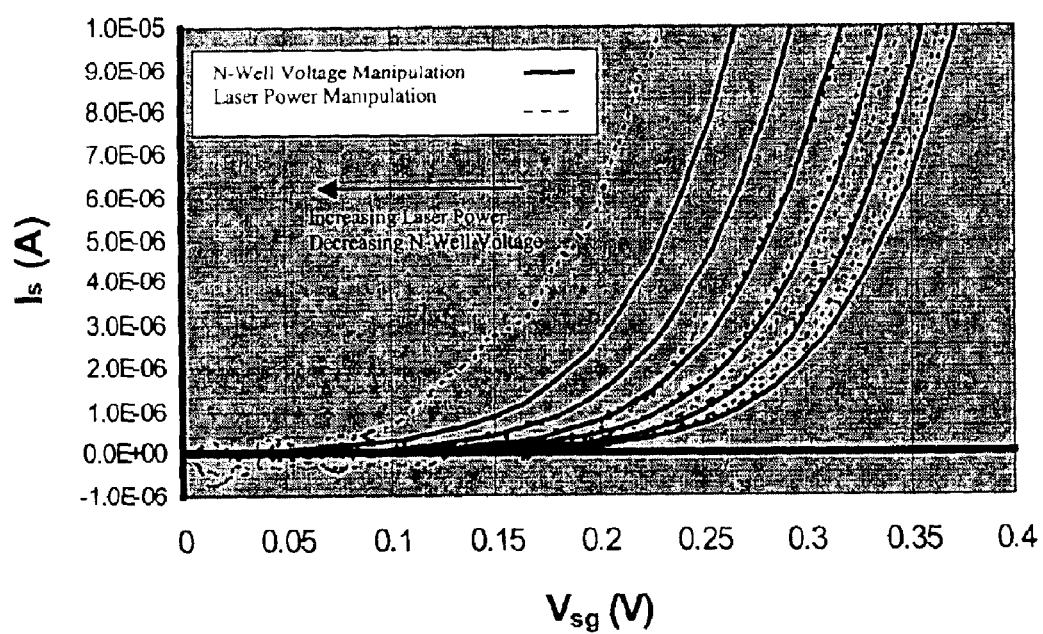
FIG. 6 is a graph depicting validation data of a p-MOS transistor, in accordance with an embodiment of the method of the present invention.

FIG. 6 is a graph comparing the measured output of a p-MOS FET using a standard testing process to establish a baseline effect and using the methods in accordance with the present invention. The standard testing process provided direct incremental changes in the n-well voltage by an external power supply. The method in accordance with the present invention provided exposing the n-well/substrate junction to increasing laser power. It is shown that increasing the laser power provides approximately the same effect on the p-MOS FET as decreasing the n-well voltage while maintaining the source voltage at a constant value. It is concluded that the magnitude of threshold voltage of the p-MOS FET is reduced as the power of the laser is increased.

Figures 7A, 7B:
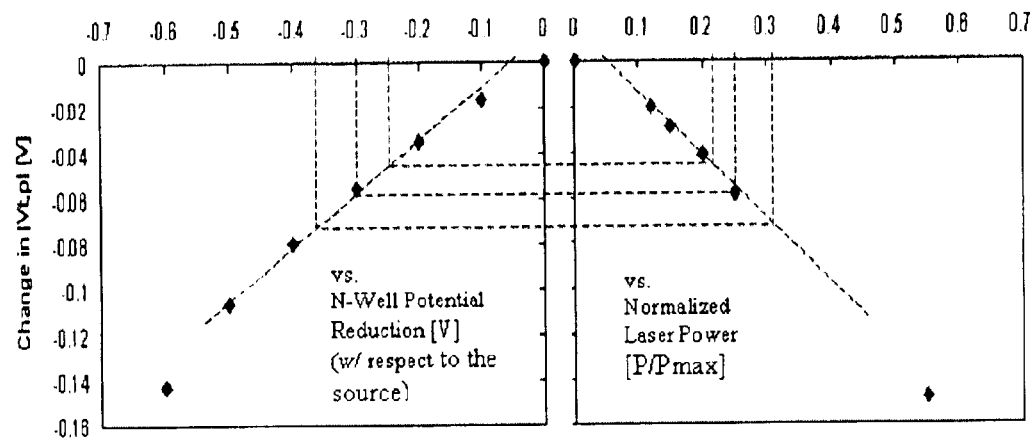
FIGS. 7A and 7B are graphs depicting validation data of a p-MOS transistor, in accordance with an embodiment of the method of the present invention.

FIGS. 7A and 7B are graphs depicting the change in the absolute value of the threshold voltage for the p-MOS FET as by manual reduction of the n-well voltage, as shown in FIG. 7A, and increasing laser power, as shown in FIG. 7B. It is concluded that changes in the threshold voltage of a p-MOS FET can lead to changes in the propagation timing of a signal traveling through that p-MOS FET by increasing the current drive capability of the transistor.

Figure 8:
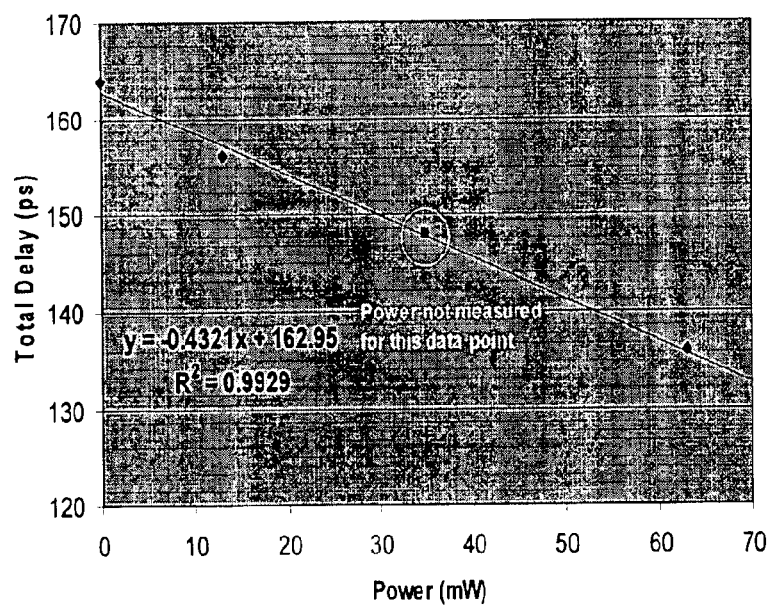
FIGS. 8–10 are graphs depicting validation data produced in accordance with embodiments of the methods of the present invention.
Figure 9:
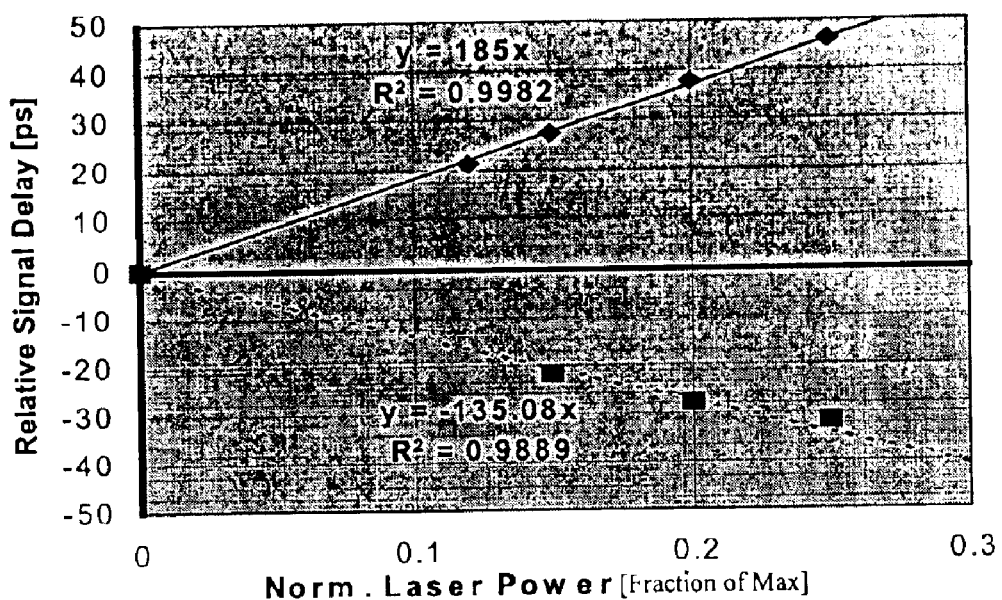

FIGS. 8 and 9 are graphs depicting data taken on two test IC's (0.25 $\mu$m and 0.13 $\mu$m-scale IC devices) to validate that the timing of a particular signal edge in simple logic chains can be continuously reduced or increased through incremental increases in the incident laser power while focusing on the p-n junctions of individual IC devices, in accordance with an embodiment of the method of the present invention. The change in timing is related to the amount of current that is injected into the IC device and other circuit parameters such as load capacitance. The data in FIG. 7 was taken on an isolated IC inverter chain. The data in FIG. 8 was taken on an IC inverting signal path.

The output of the inverter chain was directly sent to an external lead, so that any picosecond-scale (ps-scale) change in the output timing of the IC devices was measured by the test equipment. Timing shifts as significant as 50 ps, as depicted in FIG. 8, were experimentally achieved in a repeatable fashion, which clearly demonstrates the ability to alter ac characteristics of transistors and consequentially the IC.

Figure 10:
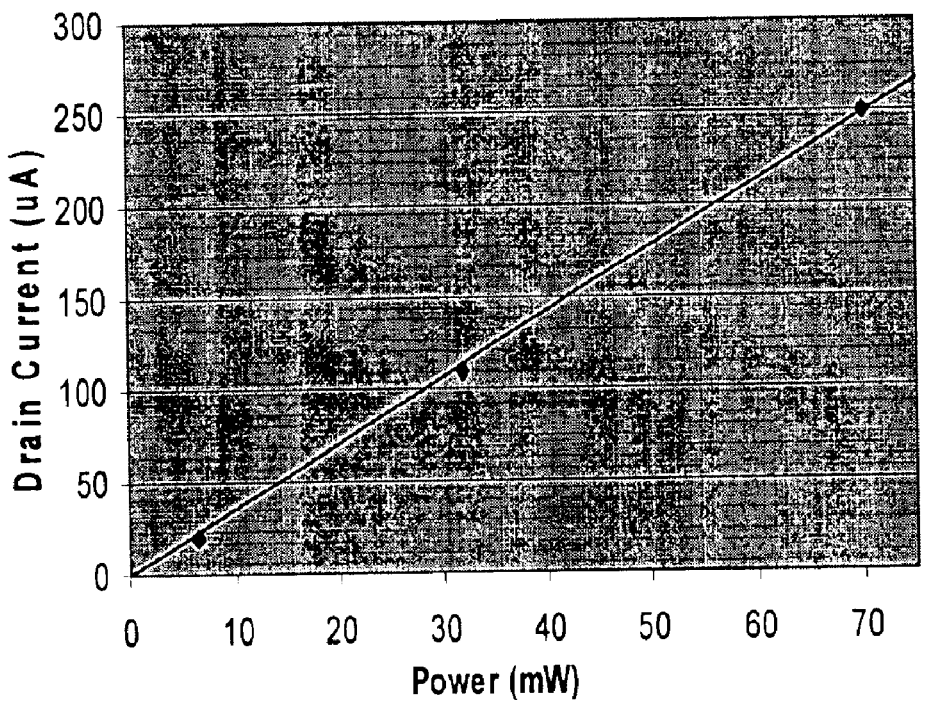

FIG. 10 is a graph depicting the drain current of an n-MOS FET as the laser beam is focused onto the drain of the FET, in accordance with an embodiment of the method of the present invention. The additional drain current produced increased linearly with increasing incident laser power. For balanced logic gates, wherein n-MOS and p-MOS transistors are sized for equal current conduction, the threshold voltage reduction in p-MOS transistors dominate the overall change in signal timing.

A unique benefit of the methods in accordance with the invention is that they are scalable to more advanced process technologies. This is possible as the data is collected from the IO interconnects of the IC, rather than directly from the node, such as with methods incorporating optical probing or time-resolved emission.

The methods in accordance with the present invention are a valid approach to gather data in a non-damaging, repeatable, and reproducible process that is used to evaluate the IC at the package (backside) level, as well as the microelectronic die level. The resolution of the radiation source, such as a laser beam, can be controlled for accurately probing advanced IC technologies, including 90 nm and beyond IC devices on microelectronic die.

The methods in accordance with the present invention are substantially faster at finding the IC devices of the IC that exhibit marginal performance than the current state of the art. The principles behind this invention provide the opportunity to automate the diagnostic process since the methods provide digital logic-based pass/fail data. In an embodiment of a method in accordance with the present invention, the IC is automatically scanned by the radiation beam. As the radiation beam moves from one IC device to the next, the IC output signals are measured. When the radiation beam illuminates a performance-limiting IC device, the IC output will deviate either below or above the predetermined threshold and the marginal IC device is identified. Identification of the marginal IC device is made based on the position of the radiation beam in relationship to the translation device. By way of example, but not limited thereto, an area of 1.5 mm×1.5 mm (1500 μm×1500 μm) of a die substrate can be systematically scanned to evaluate each IC device within the area.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method comprising:

operating an integrated circuit (IC) at test conditions to produce an output signal marginally above or below a predetermined pass/fail threshold for a particular performance criterion;

injecting one or more electron-hole pairs into an IC device to drive the output of the IC either from below the pass/fail threshold to above the pass/tail threshold or from above the pass/rail threshold to below the pass/fail threshold; and identifying the IC device as having a marginal or deficient design if the IC performance is driven either below or above the pass/fail threshold.

2. The method of claim 1, wherein electron-hole pairs are injected into a group of IC devices on the IC.

3. The method of claim 1, further comprising:

applying an operating signal provided by standard IC testing equipment;

adjusting the operating signal to drive the IC to a predetermined operating state; and measuring the output.

4. The method of claim 1, wherein operating an IC at test conditions comprises operating an IC at a system-level running software applications such that a slight change in the characteristics of an IC device within marginal circuitry will change an overall system behavior.

5. The method of claim 1, further comprising:

subjecting the IC device to an electrical test signal in the form of a change in voltage, current, and/or frequency.

6. The method of claim 5, wherein subjecting the IC device to an electrical test signal comprises heating the IC device.

7. The method of claim 1, wherein injecting one or more electron-hole pairs into the IC device comprises illuminating a p-n junction of the IC device with radiation to produce a photo-induced current in the IC device.

8. The method of claim 7, wherein illuminating the p-n junction of the IC device with radiation comprises:

illuminating and scanning radiation from a first IC device to one or more subsequent IC devices until the radiation illuminates a performance-limiting IC device evidenced by a deviation in IC output signal either below or above the predetermined threshold, the marginal IC device being identified based on the position of the radiation beam in relationship to a known location.

9. The method of claim 1, wherein injecting one or more electron-hole pairs into the IC device comprises illuminating an n-well/substrate junction of the IC device with radiation to a produce photo-induced current in the IC device.

10. The method of claim 1, wherein injecting one or more electron-hole pairs into the IC device comprises illuminating the IC device using a laser beam having a wavelength of about 1.064 μm to 1.5 μm, wherein the IC comprises a silicon substrate.

11. The method of claim 10, wherein illuminating the IC device using a laser beam comprises illuminating the IC device using a laser beam directed through the backside surface of the substrate onto the IC device located at a depth of up to 100 μm below the backside surface of the substrate.

12. The method of claim 1, further comprising:

evaluating the IC device by incrementally varying and maintaining a test signal used to inject the one or more electron-hole pairs into the IC device to adjust the output signal of the associated signal path.

13. A method comprising:

operating an integrated circuit (IC) at test conditions to produce an output signal marginally above or below a determined pass/fail threshold for a particular performance criterion;

subjecting a field effect transistor to an electrical test signal to drive the output of the IC either from below the pass/fail threshold to above the pass/fail threshold or from above the pass/fail threshold to below the pass/fail threshold; and identifying the field effect transistor as having a marginal or deficient design if the IC performance is driven either below or above the pass/fail threshold.

14. The method of claim 13, further comprising:

applying an operating signal provided by standard IC testing equipment;

adjusting the operating signal to drive the IC to a predetermined operating state; and measuring the output.

15. The method of claim 13, wherein operating an IC at test conditions comprises operating an IC at a system-level running software applications such that a slight change in the characteristics of an IC device within marginal circuitry will change an overall system behavior.

16. The method of claim 13, further comprising:

subjecting the field effect transistor to an electrical test signal in the form of a change in voltage, current, and/or frequency; and incrementally varying and maintaining the test signal to adjust the output signal of an associated signal path.

* * * * *

UNITED STATES PATENT AND TRADEMARK OFFICE
CERTIFICATE OF CORRECTION

PATENT NO. : 6,882,170 B2
APPLICATION NO. : 10/313933
DATED : April 19, 2005
INVENTOR(S) : Elles et al.

It is certified that error appears in the above-identified patent and that said Letters Patent is hereby corrected as shown below:

Col. 11, line 23, "predetermined..." should read --determined.--;

Col. 11, line 28, " ...pass/tail threshold..." should read --...pass/fail threshold...--; and Col. 11, line 29, " ...pass/rail threshold..." should read --...pass/fail threshold...--.

Signed and Sealed this

Fifteenth Day of August, 2006

JON W. DUDAS
*Director of the United States Patent and Trademark Office*